(12) United States Patent
Nakaji

(10) Patent No.: US 7,675,130 B2
(45) Date of Patent: Mar. 9, 2010

(54) WAVEGUIDE PHOTODETECTOR

(75) Inventor: Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/332,408

(22) Filed: Dec. 11, 2008

(65) Prior Publication Data

US 2009/0321868 A1    Dec. 31, 2009

(30) Foreign Application Priority Data

Jun. 27, 2008    (JP) .............................. 2008-168719

(51) Int. Cl.
*H01L 31/0304*    (2006.01)

(52) U.S. Cl. ............... 257/431; 257/436; 257/E31.021; 257/200; 257/E31.121

(58) Field of Classification Search ................ 257/431, 257/436, 200, E31.021, E31.121
See application file for complete search history.

(56) References Cited

U.S. PATENT DOCUMENTS 5,770,466 A * 6/1998 Sasaki et al. .................. 438/31
6,734,519 B1 * 5/2004 Nakaji et al. ................. 257/458
6,737,718 B2    5/2004 Takeuchi
7,020,375 B2    3/2006 Nakaji et al.
7,415,185 B2    8/2008 Nakaji et al.
2006/0043518 A1    3/2006 Nakaji et al.

FOREIGN PATENT DOCUMENTS

| JP | 6-204549 A | 7/1994 |
| JP | 2000-164916 A | 6/2000 |
| JP | 2002-203984 A | 7/2002 |
| JP | 2004-146408 A | 5/2004 |

* cited by examiner

*Primary Examiner*—Davienne Monbleau
*Assistant Examiner*—Benjamin Tzu-Hung Liu
(74) *Attorney, Agent, or Firm*—Leydig, Voit & Mayer, Ltd.

(57) ABSTRACT

A waveguide photodetector detecting light incident on a light detecting end face includes: a substrate; and a layer stack structure on the substrate and including a semiconductor layer of a first conductivity type, an undoped semiconductor layer, and a semiconductor layer of a second conductivity type. The undoped semiconductor layer includes two or more undoped light absorbing layers and undoped non-light-absorbing layers. One non-light-absorbing layer is disposed between adjacent undoped light absorbing layers. The non-light-absorbing layers have a bandgap wavelength shorter than the wavelength of the incident light that is detected.

4 Claims, 6 Drawing Sheets

WAVEGUIDE PHOTODETECTOR

BACKGROUND OF THE INVENTION

1. Field of the Invention

The present invention relates to a waveguide photodetector used in receiver and transceiver modules for optical communications systems, and more particularly to such a waveguide photodetector capable of high speed response and having high reliability.

2. Background Art

In photodetectors adapted to receive incident light on their surface (referred to as "surface-receiving photodetectors"), the received signal light enters the light absorbing layer perpendicular to its surface. Therefore, an improvement in the response characteristics of these photodetectors (i.e., a reduction in the carrier transit time) requires a decrease in the thickness of the light absorbing layer, whereas an increase in their photoelectric conversion efficiency (or external quantum efficiency) requires an increase in the thickness of the light absorbing layer. That is, with surface-receiving photodetectors there is a trade-off between the response characteristics and the photoelectric conversion efficiency. On the other hand, in the case of waveguide photodetectors, in which the signal light enters an end face of the light absorbing layer (i.e., enters the layer parallel to its surface), their photoelectric conversion efficiency can be increased by increasing the length of the waveguide (or the light absorbing layer) even if the light absorbing layer has a small thickness, allowing the desired photoelectric conversion efficiency to be established without taking the carrier transit time into account, and vice versa.

For example, the waveguide photodetector disclosed in Japanese Laid-Open Patent Publication No. 2004-146408 achieves high speed response, namely, has a 3 dB cutoff frequency of 40 GHz or more, due to the small thickness of its light absorbing layer (0.5 µm), and still exhibits high photoelectric conversion efficiency (80% or higher).

SUMMARY OF THE INVENTION

Since waveguide photodetectors receive incident light on their light receiving end face, a large photoelectric current flows in the portion extending from this end face, thereby generating heat therein. This may result in degradation or destruction of the photodetectors; that is, waveguide photodetectors do not have very high reliability. In order to avoid this problem, a waveguide photodetector has been proposed in which the light absorbing layer is formed of a material having a low absorption coefficient to reduce the photoelectric current generated in the light receiving end face portion. In this case, however, the waveguide length of the photodetector must be increased to ensure a sufficient photoelectric conversion efficiency, which results in increased device capacitance and hence lower response speed.

The present invention has been devised to solve the above problems. It is, therefore, an object of the present invention to provide a waveguide photodetector capable of high speed response and having high reliability.

According to one aspect of the present invention, a waveguide photodetector adapted to receive incident light on a light receiving end face thereof, comprises: a substrate; and a layer stack structure formed on said substrate and including a semiconductor layer of a first conductivity type, an undoped semiconductor layer, and a semiconductor layer of a second conductivity type formed on top of one another in that order, said undoped semiconductor layer being not intentionally doped with any impurities; wherein said undoped semiconductor layer includes two or more undoped light absorbing layers formed in a stacked configuration and further includes one or more undoped non-light-absorbing layers each disposed between adjacent ones of said two or more undoped light absorbing layers; and wherein said one or more non-light-absorbing layers have a bandgap wavelength shorter than the wavelength of said incident light.

Thus the present invention provides a waveguide photodetector capable of high speed response and having high reliability.

Other and further objects, features and advantages of the invention will appear more fully from the following description.

DETAILED DESCRIPTION OF THE PREFERRED EMBODIMENTS

First Embodiment

Figure 1:
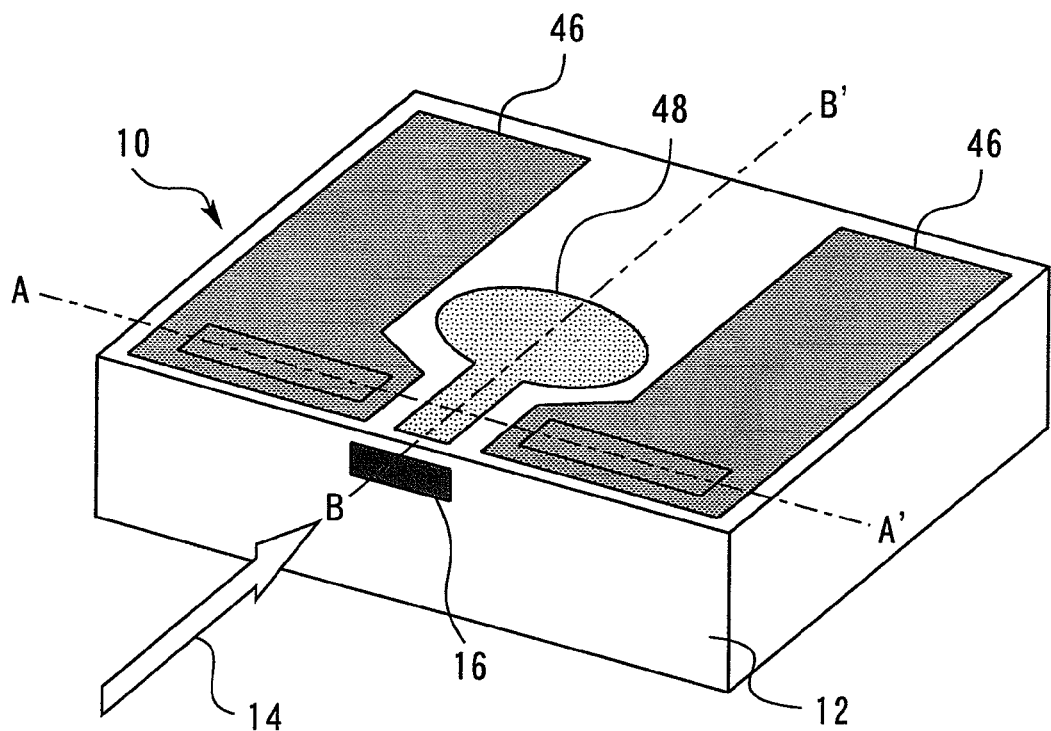
FIG. 1 is a perspective view of a waveguide photodetector 10 according to a first embodiment of the present invention.

FIG. 1 is a perspective view of a waveguide photodetector 10 according to a first embodiment of the present invention. Light 14 incident on the light receiving end face 12 of the waveguide photodetector 10 propagates through a waveguide 16 toward the other end of the photodetector while being progressively absorbed in the waveguide.

Figure 2:
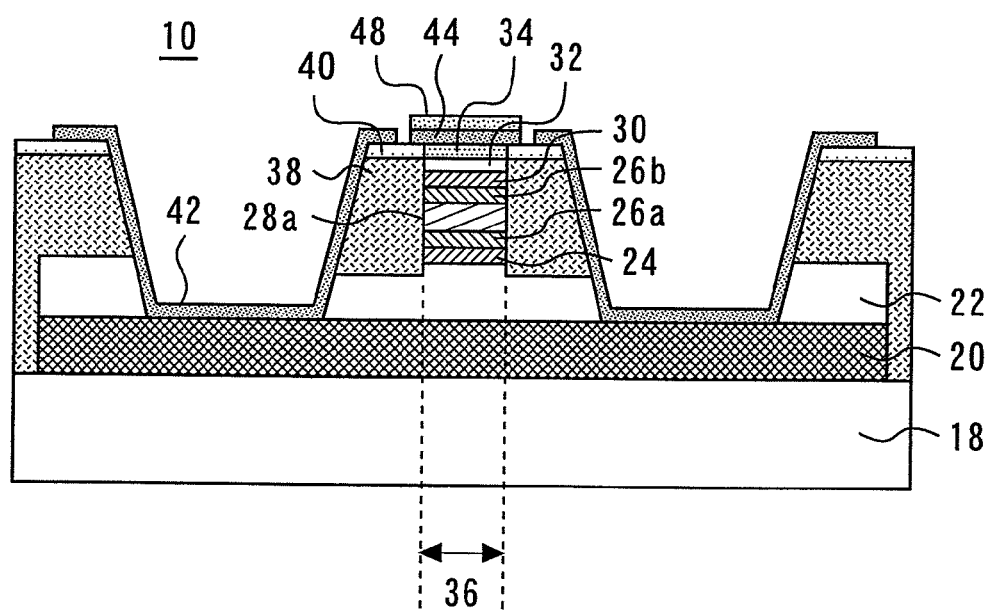
FIG. 2 is a cross-sectional view taken along line A-A' of FIG. 1.
Figure 3:
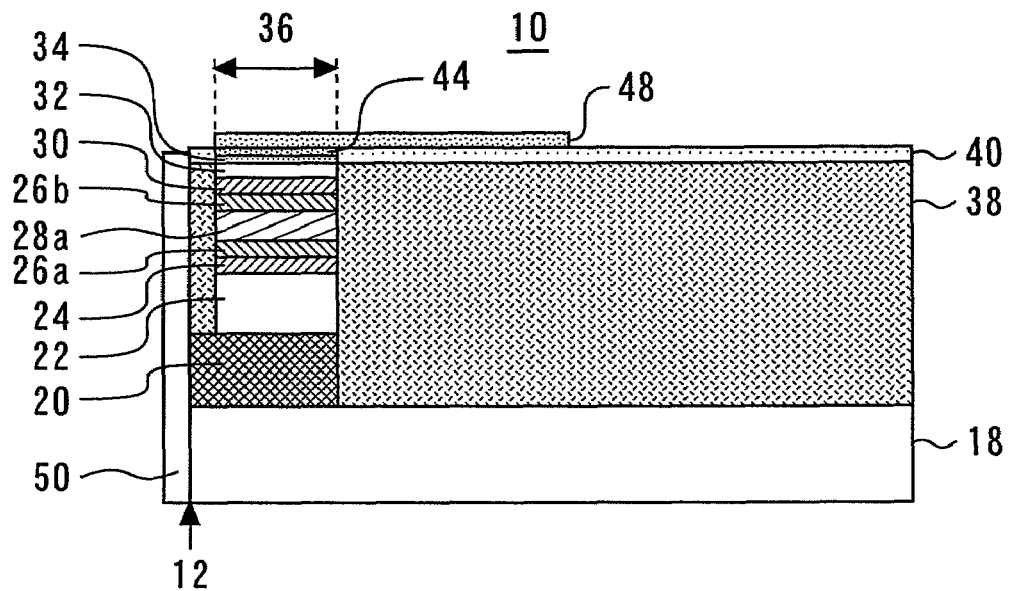
FIG. 3 is a cross-sectional view taken along line B-B' of FIG. 1.

FIG. 2 is a cross-sectional view taken along line A-A' of FIG. 1, and FIG. 3 is a cross-sectional view taken along line B-B' of FIG. 1. Referring to FIGS. 2 and 3, the waveguide photodetector 10 includes a layer stack structure (or laminated structure) formed on a semi-insulating Fe—InP substrate 18. The layer stack structure includes an n-InGaAs contact layer 20, an n-InP cladding layer 22, an n-InGaAsP guiding layer 24 (having a composition for providing a wavelength of 1.4 μm), an i-InGaAs light absorbing layer 26a (0.15 μm thick), an i-InGaAsP non-light-absorbing layer 28a (0.2 μm thick), an i-InGaAs light absorbing layer 26b (0.15 μm thick), a p-InGaAsP guiding layer 30 (having a composition for providing a wavelength of 1.4 μm), a p-InP cladding layer 32, and a p-InGaAs contact layer 34 formed on top of one another by MOCVD or MBE in that order. It should be noted that the i-InGaAs light absorbing layers 26a and 26b and the i-InGaAsP non-light-absorbing layer 28a are undoped semiconductor layers (i.e., not intentionally doped with any impurities).

The layer stack structure is etched such that the n-InP cladding layer 22 and the overlying layers are partially removed, forming a mesa-shaped waveguide as shown in FIG. 2. The remaining portions of the p-InGaAs contact layer 34 and the underlying layers constitute a photoelectric conversion portion 36 for photoelectrically converting the incident light 14 into a current. The length of the photoelectric conversion portion 36 in the propagation direction of the incident light 14 is 20 μm.

A Fe-doped InP layer 38 buries, or covers, both sides of the photoelectric conversion portion, or mesa-shaped layer stack structure, 36. It should be noted that the Fe-doped InP layer 38 is a burying layer having a bandgap wavelength shorter than the wavelength of the incident light 14.

A silicon nitride film 40 covers the device surface. A portion of the silicon nitride film 40 is removed to expose the p-InGaAs contact layer 34. Further, other portions of the silicon nitride film 40 and portions of the Fe-doped InP layer 38 and the n-InP cladding layer 22 are removed to expose the n-InGaAs contact layer 20. An n-side Ti/Au electrode 42 and a p-side Ti/Au electrode 44 are connected to the exposed portions of the n-InGaAs contact layer 20 and p-InGaAs contact layer 34, respectively. Ti/Au electrode pads 46 and 48 are connected to the Ti/Au electrodes 42 and 44, respectively. These electrode pads 46 and 48 have larger surface areas than the electrodes 42 and 44 to ensure a reliable electrical connection with external components. An antireflective film 50 is formed on the light receiving end face 12.

Thus according to the present embodiment, the i-InGaAsP non-light-absorbing layer 28 is disposed between the i-InGaAs light absorbing layer 26a and the adjacent i-InGaAs light absorbing layer 26b. This i-InGaAsP non-light-absorbing layer 28a has a bandgap wavelength shorter than the wavelength of the incident light 14.

Figure 4:
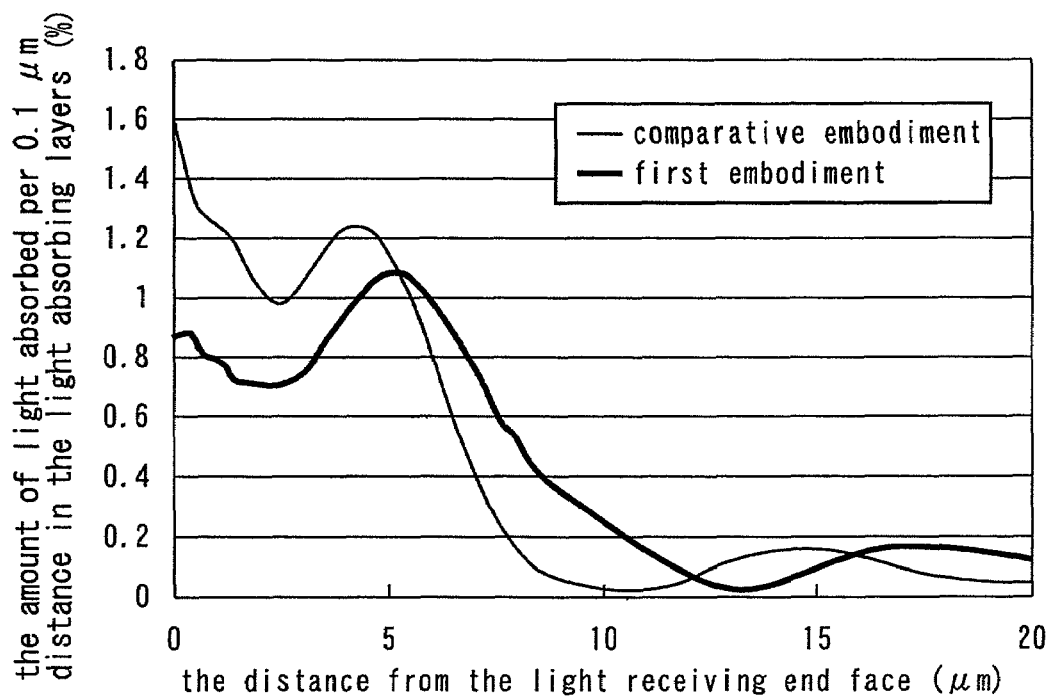
FIG. 4 is a graph showing the relationship between the distance from the light receiving end face and the amount of light absorption for the waveguide photodetector of the present embodiment and for a comparative waveguide photodetector.
Figure 5:
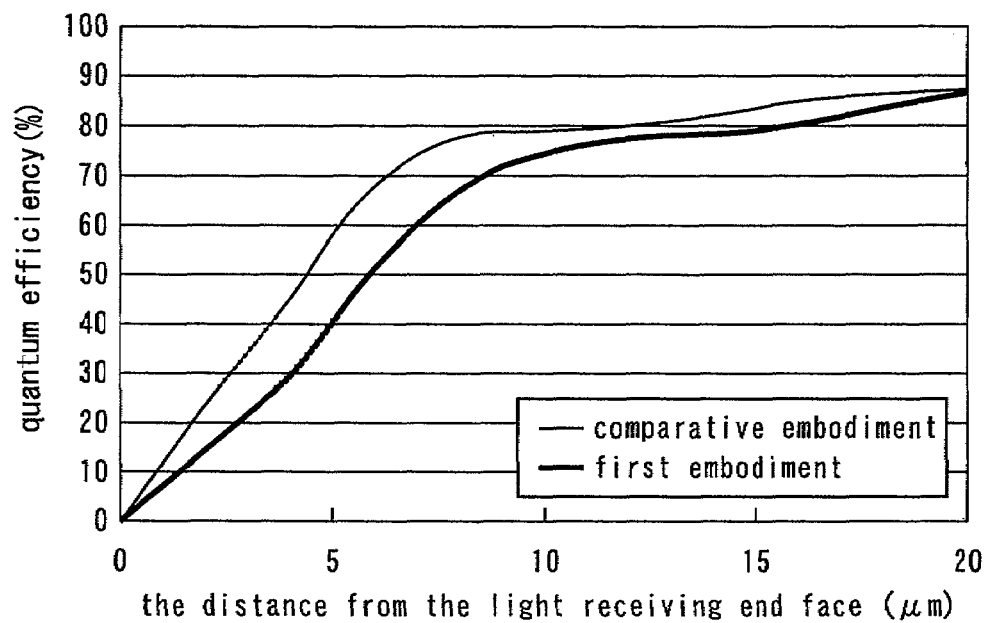
FIG. 5 is a graph showing the relationship between the distance from the light receiving end face and the total amount of light absorbed by the portions of the light absorbing layers within that distance (i.e., the quantum efficiency) for the waveguide photodetector of the present embodiment and for the comparative waveguide photodetector.

FIG. 4 is a graph showing the relationship between the distance from the light receiving end face and the amount of light absorption for the waveguide photodetector of the present embodiment and for a comparative waveguide photodetector. More specifically, the horizontal axis of the graph represents the distance (in μm) from the light receiving end face, and the vertical axis represents the amount of light absorbed per 0.1 μm distance in the light absorbing layers relative to the amount of incident light (%). FIG. 5 is a graph showing the relationship between the distance from the light receiving end face and the total amount of light absorbed by the portions of the light absorbing layers within that distance (i.e., the quantum efficiency) for the waveguide photodetector of the present embodiment and for the comparative waveguide photodetector. This graph was obtained by the beam propagation method, assuming that the incident light 14 has a wavelength of 1.55 μm. It should be noted that the comparative waveguide photodetector differs from the waveguide photodetector of the present embodiment in that a light absorbing layer with a thickness of 0.5 μm is substituted for the i-InGaAs light absorbing layers 26a and 26b and the i-InGaAsP non-light-absorbing layer 28a.

As shown in the graph of FIG. 5, the end face portion of the light absorbing layer of the comparative waveguide photodetector absorbs a large amount of light, and the portion of the light absorbing layer that is not within approximately 7 μm of the light receiving end face absorbs little light. (That is, the cumulative amount of light absorption substantially saturates, or stops increasing, at a distance of 7 μm from the light receiving end face.) In the waveguide photodetector of the present embodiment, on the other hand, the light receiving end face portion absorbs only a relatively small amount of light, resulting in a reduction in the generation and concentration of photoelectric current due to the light absorption of the light receiving end face portion. As a result, the light receiving end face portion of the waveguide photodetector of the present embodiment does not significantly heat up even when a large optical signal is applied to it, thereby preventing the degradation and destruction of the photodetector. That is, the waveguide photodetector of the present embodiment has high reliability.

Further in the case of the waveguide photodetector of the present embodiment, the incident light is absorbed even by portions of the light absorbing layers 10 μm or more away from the light receiving end face, and the total amount of light absorbed by the portions of the light absorption layers within 20 μm of the light receiving end face is 80% or more (of the amount of incident light). This means that the waveguide can be relatively short in length, resulting in high speed response of the photodetector.

Second Embodiment

Figure 6:
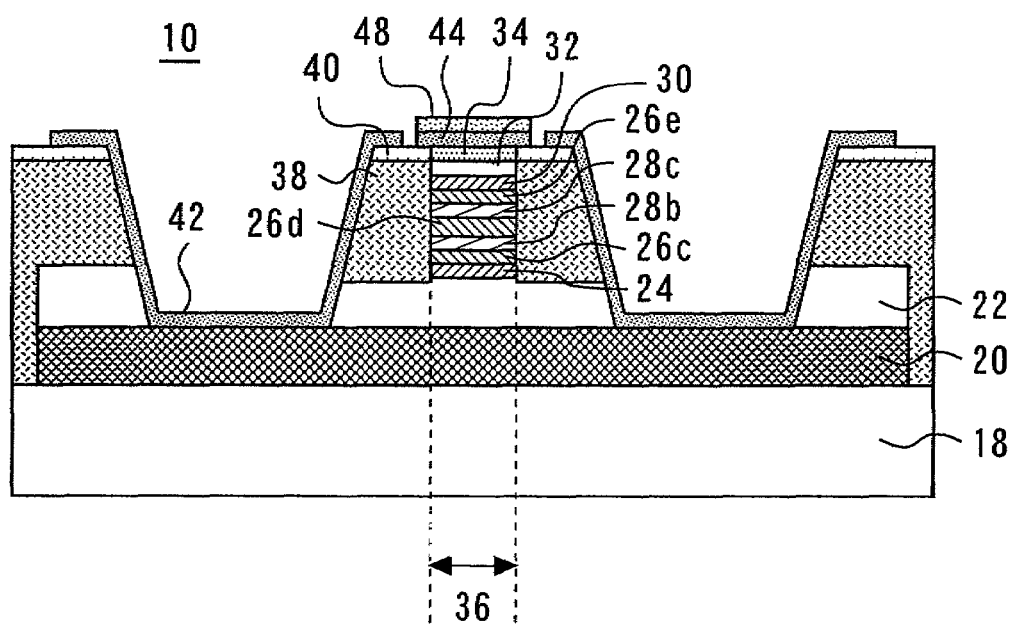
FIGS. 6 and 7 show, in cross-section, a waveguide photodetector according to a second embodiment of the present invention.
Figure 7:
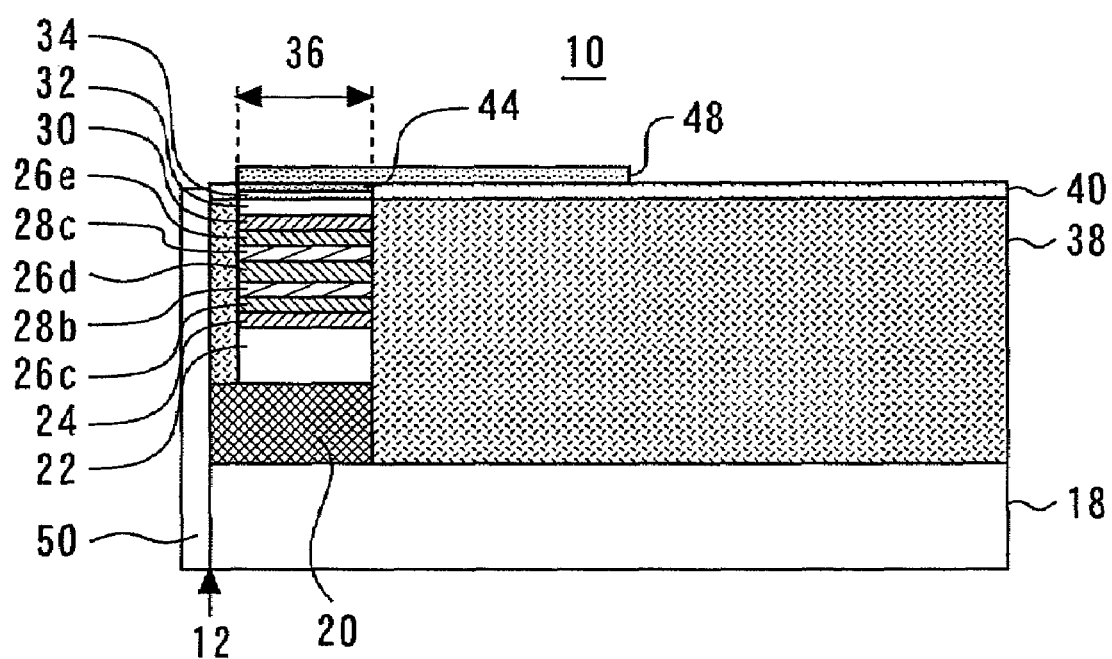

FIGS. 6 and 7 show, in cross-section, a waveguide photodetector according to a second embodiment of the present invention. The perspective view of FIG. 1 also applies to this waveguide photodetector. That is, FIG. 6 is a cross-sectional view of the photodetector taken along line A-A' of FIG. 1, and FIG. 7 is a cross-sectional view taken along line B-B' of FIG. 1.

The waveguide photodetector of the present embodiment differs from that of the first embodiment in that it includes, as undoped semiconductor layers, an i-InGaAs light absorbing layer 26c (0.05 μm thick), an i-InGaAsP non-light-absorbing layer 28b (0.15 μm thick), an i-InGaAs light absorbing layer 26d (0.1 μm thick), an i-InGaAsP non-light-absorbing layer 28c (0.15 μm thick), and an i-InGaAs light absorbing layer 26e (0.05 μm thick) formed on top of one another in that order, instead of the i-InGaAs light absorbing layers 26a and 26b and the i-InGaAsP non-light-absorbing layer 28a. All other components are the same as in the first embodiment.

Figure 8:
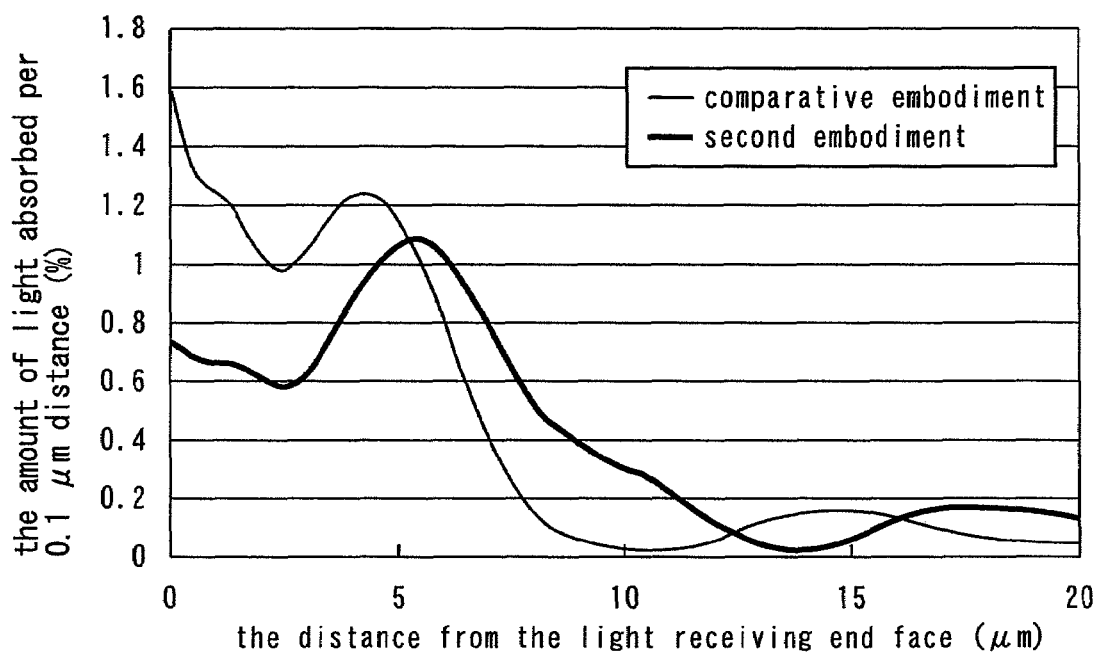
FIG. 8 is a graph showing the relationship between the distance from the light receiving end face and the amount of light absorption for the waveguide photodetector of the present embodiment and for the comparative waveguide photodetector described in connection with the first embodiment.
Figure 9:
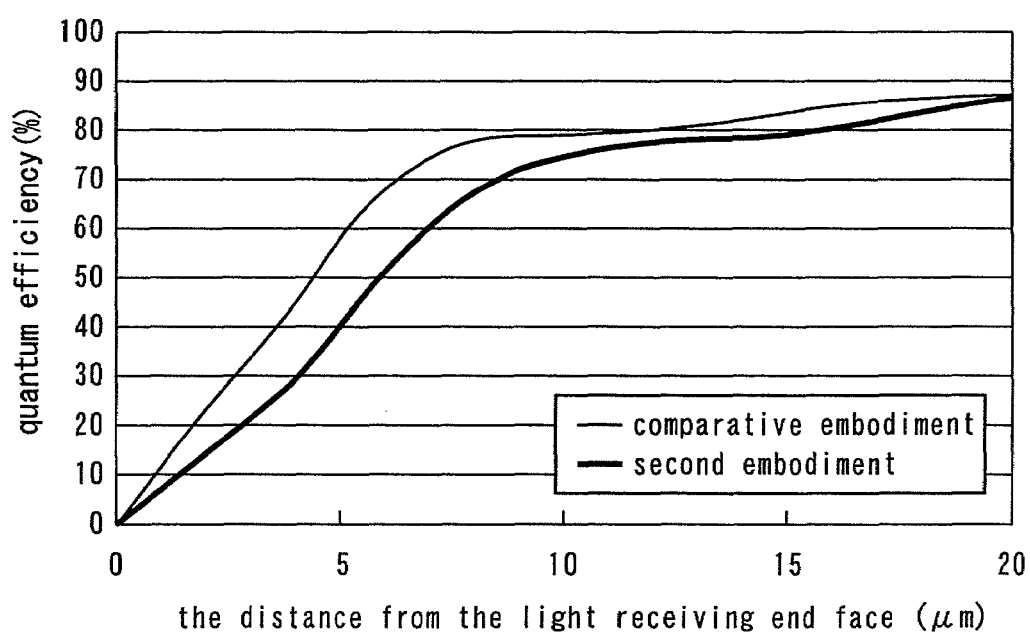
FIG. 9 is a graph showing the relationship between the distance from the light receiving end face and the total amount of light absorbed by the potions of the absorbing layers within that distance (i.e., the quantum efficiency) for the waveguide photodetector of the present embodiment and for the comparative waveguide photodetector.

FIG. 8 is a graph showing the relationship between the distance from the light receiving end face and the amount of light absorption for the waveguide photodetector of the present embodiment and for the comparative waveguide photodetector described in connection with the first embodiment. FIG. 9 is a graph showing the relationship between the distance from the light receiving end face and the total amount of light absorbed by the potions of the absorbing layers within that distance (i.e., the quantum efficiency) for the waveguide photodetector of the present embodiment and for the comparative waveguide photodetector.

Thus the waveguide photodetector of the present embodiment includes three light absorbing layers formed with two non-light-absorbing layers sandwiched therebetween. As shown in the graph of FIG. 9, this waveguide photodetector also has the advantages described above in connection with the first embodiment. It is to be understood that a waveguide photodetector including four or more light absorbing layers (with non-light-absorbing layers therebetween) may have the same advantages.

Third Embodiment

Figure 10:
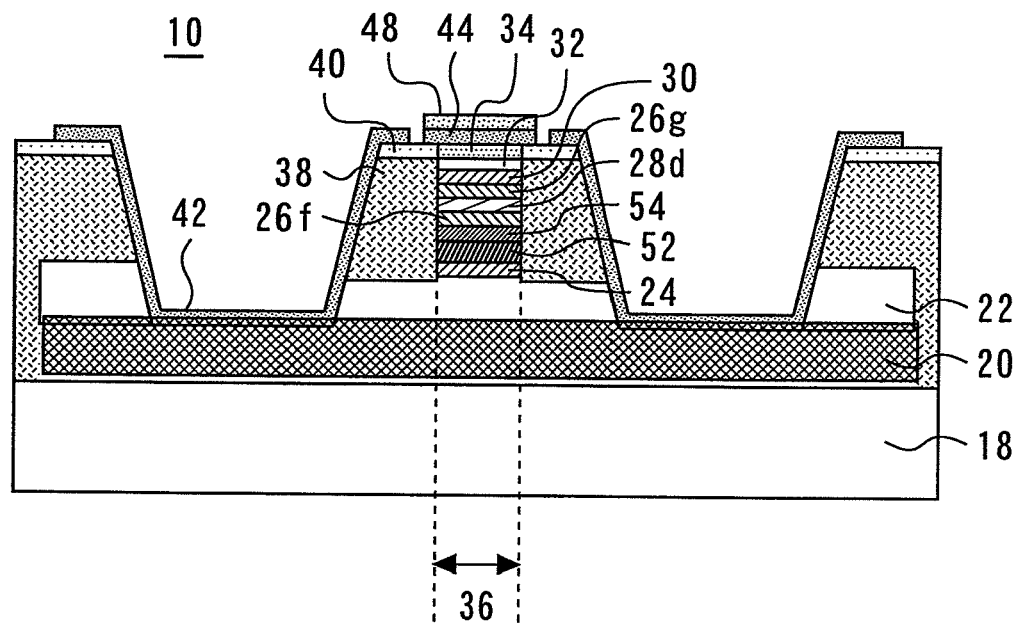
FIGS. 10 and 11 show, in cross-section, a waveguide photodetector according to a third embodiment of the present invention.
Figure 11:
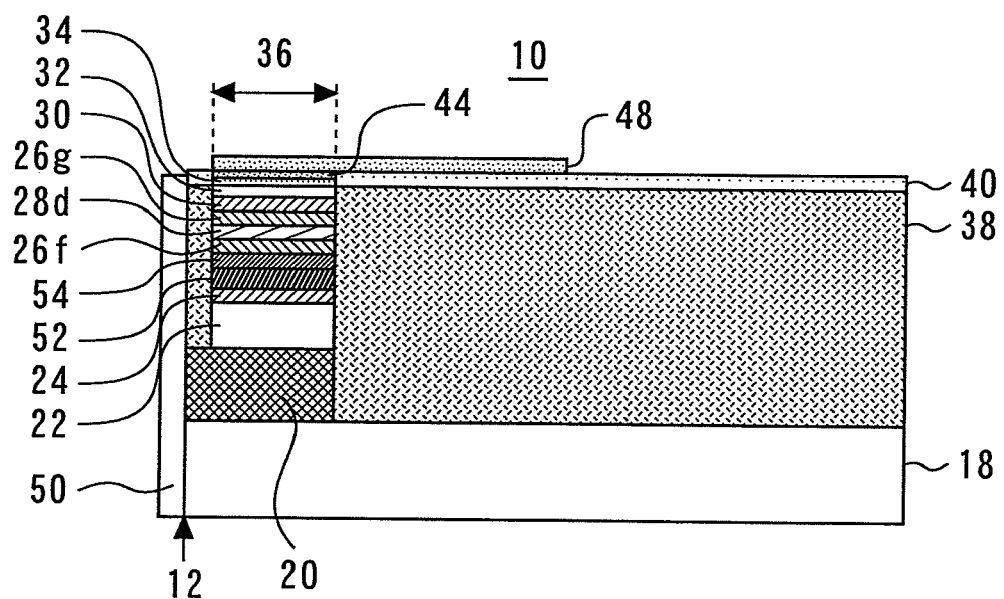

FIGS. 10 and 11 show, in cross-section, a waveguide photodetector according to a third embodiment of the present invention. The perspective view of FIG. 1 also applies to this waveguide photodetector. That is, FIG. 10 is a cross-sectional view of the photodetector taken along line A-A' of FIG. 1, and FIG. 11 is a cross-sectional view taken along line B-B' of FIG. 1.

The waveguide photodetector of the present embodiment differs from that of the first embodiment in that it includes an i-AlInAs multiplication layer 52, a p-AlInAs electric field reduction layer 54, an i-InGaAs light absorbing layer 26f (0.15 μm thick), an i-InGaAsP non-light-absorbing layer 28d (0.2 μm thick), and an i-InGaAs light absorbing layer 26g (0.15 μm thick) formed on top of one another in that order, instead of the i-InGaAs light absorbing layers 26a and 26b and the i-InGaAsP non-light-absorbing layer 28a. All other components are the same as in the first embodiment.

Thus the waveguide photodetector of the present embodiment is an avalanche photodiode having a built-in multiplication capability. Like the pin photodiodes of the first and second embodiments, this avalanche photodiode has the advantages described above in connection with the first embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-168719, filed on Jun. 27, 2008 including specification, claims, drawings and summary, on which the Convention priority of the present application is based, are incorporated herein by reference in its entirety.

What is claimed is:

1. A waveguide photodetector detecting light incident on a light detecting end face, comprising:
    a substrate; and
    a layer stack structure on said substrate and including a semiconductor layer of a first conductivity type, an undoped semiconductor layer, and a semiconductor layer of a second conductivity type, stacked on one another in that order, said undoped semiconductor layer being not intentionally doped with any dopant impurity, wherein
    said undoped semiconductor layer includes at least two undoped light-absorbing layers in a stacked configuration and at least one undoped non-light-absorbing layer, each undoped non-light-absorbing layer being sandwiched by an adjacent pair of the undoped light-absorbing layers,
    said non-light-absorbing layers have a bandgap wavelength shorter than the wavelength of the incident light that is detected, and
    each of the non-light-absorbing layers is at least 150 nm thick.

2. The wavelength photodetector as claimed in claim 1, wherein said layer stack structure has a mesa shape and acts as a waveguide, and including a burying layer burying opposite sides of said layer stack structure, said burying layer having a bandgap wavelength shorter than the wavelength of the incident light that is detected.

3. A waveguide photodetector detecting light incident on a light detecting end face, comprising:
    a substrate; and
    a layer stack structure on said substrate and including a semiconductor layer of a first conductivity type, an undoped semiconductor layer, and a semiconductor layer of a second conductivity type, stacked on one another in that order, said undoped semiconductor layer being not intentionally doped with any dopant impurity, wherein
    said undoped semiconductor layer includes at least two undoped light-absorbing layers in a stacked configuration and at least one undoped non-light-absorbing layer, each undoped non-light-absorbing layer being sandwiched by an adjacent pair of the undoped light-absorbing layers,
    said non-light-absorbing layers have a bandgap wavelength shorter than the wavelength of the incident light that is detected, and
    each non-light-absorbing layer and the pair of light-absorbing layers sandwiching the non-light-absorbing layer have a total thickness of at least 300 nm.

4. The wavelength photodetector as claimed in claim 3, wherein said layer stack structure has a mesa shape and acts as a waveguide, and including a burying layer burying opposite sides of said layer stack structure, said burying layer having a bandgap wavelength shorter than the wavelength of the incident light that is detected.

* * * * *